(12) United States Patent
Okada (10) Patent No.: US 6,407,385 B1
(45) Date of Patent: Jun. 18, 2002

(54) METHODS AND APPARATUS FOR REMOVING PARTICULATE FOREIGN MATTER FROM THE SURFACE OF A SAMPLE

(75) Inventor: Masashi Okada, Ibaraki (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/464,739

(22) Filed: Dec. 15, 1999

(30) Foreign Application Priority Data

| Dec. 18, 1998 | (JP) | ............................................ 10-360112 |
| Jan. 12, 1999 | (JP) | ............................................ 11-005115 |
| Jan. 12, 1999 | (JP) | ............................................ 11-005116 |

(51) Int. Cl.[7] ............................ G01N 23/00; G21K 7/00
(52) U.S. Cl. ...................................... 250/306; 250/307
(58) Field of Search ............................. 134/1; 250/306, 250/310, 307, 227.27; 422/82.05, 82.11, 82.09; 356/246, 451, 440, 301; 436/807, 527, 164, 805

(56) References Cited

U.S. PATENT DOCUMENTS

| 4,980,536 A | | 12/1990 | Asch et al. | |
| 5,215,592 A | * | 6/1993 | Jackson | ............................ 134/1 |
| 5,236,602 A | * | 8/1993 | Jackson | ........................ 210/748 |
| 5,366,559 A | * | 11/1994 | Periasamy | ........................ 134/1 |
| 5,669,979 A | * | 9/1997 | Elliot et al. | ........................ 134/1 |
| 5,929,981 A | * | 7/1999 | Keilbach | ........................ 356/73 |

FOREIGN PATENT DOCUMENTS

JP     6-95510     11/1994

OTHER PUBLICATIONS

Tam et al., "Laser–Cleaning Techniques for Removal of Surface Particulates," *J. Appl. Phys.* 71:3515–3523 (1992).

\* cited by examiner

*Primary Examiner*—Jack Berman
*Assistant Examiner*—Johnnie C. Smith, II
(74) *Attorney, Agent, or Firm*—Klarquist Sparkman LLP (57) ABSTRACT

Methods and apparatus are disclosed in which pulses of laser light are used to remove particles from a sample surface. The laser light can have a wavelength absorbed by water, and the sample surface can be coated with a film of water. To prevent decreasing the intensity of the laser light propagating from a source to the sample, a propagation path is provided from the source to the sample that contains an environment lacking water vapor or other gas that significantly absorbs at a wavelength similar to that at which water absorbs the laser light. The methods and apparatus can also include observing the sample in real time as the sample is being irradiated with the laser light. The methods and apparatus can also include vibrating the sample as the sample is being irradiated to facilitate removal of the particles, thereby allowing the intensity of the laser light to be decreased to levels that do not damage the sample surface.

34 Claims, 3 Drawing Sheets

METHODS AND APPARATUS FOR REMOVING PARTICULATE FOREIGN MATTER FROM THE SURFACE OF A SAMPLE

FIELD OF THE INVENTION

The present invention relates to microlithography as used to transfer a pattern, defined by a reticle or mask, onto a substrate such as a semiconductor wafer. Microlithography methods and apparatus are used extensively in the manufacture of semiconductor integrated circuits, memories, high-resolution displays, and the like. More specifically, the invention pertains to methods and apparatus for cleaning a reticle or mask, or a substrate such as a semiconductor wafer, to remove foreign particulate matter adhering thereto.

BACKGROUND OF THE INVENTION

In microlithography of a fine circuit pattern, as defined by a reticle, onto a wafer or other substrate, the high pattern resolution now required makes any particulate contamination on the reticle or wafer intolerable. I.e., particulate contamination typically causes defects in the fine circuit pattern as projected onto the wafer. Such defects can impair the function of the semiconductor device or display, resulting in product rejects.

Currently, foreign matter adhering to a substrate or reticle is usually removed by wet cleaning using a liquid exhibiting a chemical effect on the foreign matter. However, such wet cleaning typically requires multiple off-line steps to execute. The resulting increased handling increases the probability of re-contamination or damage and can substantially reduce throughput. Hence, considerable effort is being expended to develop practical "dry" cleaning methods for reticles and wafers.

One example of a conventional dry cleaning method is disclosed in Japanese laid-open patent publication no. *Hei* 6-95510, in which small particles are removed from a reticle by irradiating the reticle with pulsed laser light. The pulsed laser light serves to either vaporize the particles adhering to the reticle surface or remove the particles from the reticle surface. The latter is achieved by accelerating the particle, relative to the reticle, due to a rapid laser-induced thermal expansion of the particle relative to the reticle surface.

As disclosed in Tam et al., *Journal of Applied Physics* 71:3515–3523 (1992), a film of water is applied to a surface of a sample (e.g., wafer or reticle) requiring cleaning. By locally irradiating the water film with a pulse of laser light, the water film in the vicinity of the incident laser light is evaporated from the sample surface. The resulting sudden and explosive localized production of water vapor helps dislodge contaminant particles from the sample surface in the vicinity of the incident laser light, which tends to enhance the cleaning effect.

Unfortunately, conventional laser-cleaning systems utilizing a surficial water film exhibit certain problems. One problem concerns the atmosphere of water vapor through which the laser beam must pass as the beam propagates from the laser source to the sample. Since the laser produces a wavelength that is absorbed by the water film, passage of the laser beam through the atmosphere including water vapor substantially reduces the intensity of the laser beam and degrades cleaning efficacy. If the amount of water in the atmosphere traversed by the laser beam varies, then the intensity of the laser light with which the sample is irradiated correspondingly varies. Consequently, cleaning is inconsistent.

Another problem with conventional laser-cleaning systems is a difficulty in ascertaining whether the target particulate contaminant has actually been removed during cleaning. In conventional practice, inspecting whether a cleaning step has been effective is determined in an off-line inspection step after performing the cleaning step. Unfortunately, if the cleaning step was not effective, the sample must be returned to have the cleaning step repeated, after which the sample must be inspected again. Such a protocol substantially reduces throughput and increases production costs.

Conventional laser-cleaning systems also achieve inconsistent cleaning because, in general, the smaller the particle of contaminant matter adhering to the sample, the greater the tenacity with which the particle adheres to the sample. Cleaning efficacy can be improved by increasing the intensity of the laser light; however, increased intensity increases the risk of damaging the sample itself.

SUMMARY OF THE INVENTION

In view of the shortcomings of the conventional art as summarized above, an object of the present invention is to provide improved methods and apparatus for removing particles of foreign matter from the surface of a sample (such as a semiconductor wafer) using pulses of laser light, wherein propagation of the laser light from a laser source to the sample is not accompanied by any significant decrease in the intensity of the light.

According to a first aspect of the invention, methods are provided for removing particles of foreign matter from the surface of a sample. According to a first representative embodiment, a film of water is formed on the surface of the sample. A propagation path is provided for laser light propagating from a laser source to the sample surface. Provided in the propagation path is an environment exhibiting essentially no absorption of the laser light at a wavelength at which water would absorb the laser light. Such an environment is termed herein a "dry" environment. A pulse of the laser light, having a wavelength that is absorbed by water, is directed from the laser source through the propagation path to a locus on the surface of the sample, wherein the locus is a location on the surface of the sample at which the particle of foreign matter is attached to the sample surface.

The environment in the propagation path can include a gas. According to one example, the gas is a single gas or gas mixture that lacks water vapor. According to another example, the gas is an inert gas or mixture of such gases. Alternatively, the environment in the propagation path can be a vacuum.

According to another aspect of the invention, apparatus are provided for removing particles of foreign matter from a surface of a sample. A first representative embodiment of such an apparatus comprises a pulsed laser light source that produces pulsed laser light having a wavelength absorbed by water. An applicator is situated and configured to form a film of water on the surface of the sample. In a propagation path extending from the laser light source to the sample is provided a propagation environment for the laser light that exhibits essentially no absorption of the laser light at a wavelength at which water would absorb the laser light. Such an apparatus can include an optical system situated relative to the laser light source and configured to irradiate a locus on a sample with the pulsed laser light, wherein the locus includes a particle of foreign matter adhering to the sample. The propagation environment can be a vacuum.

Alternatively, the propagation environment can include a gas or gas mixture that lacks water vapor. For example, the gas can be an inert gas or mixture of such gases.

The propagation path desirably comprises a beam conduit. If the propagation environment is a vacuum (e.g., about 10 Pa pressure), then the beam conduit can be connected to a vacuum pump to create the vacuum in the beam conduit.

If the propagation environment includes a gas, then the beam conduit can be connected via a gas-supply tube or analogous structure to a gas supply.

By way of example, the beam conduit can be filled with nitrogen gas which is effective in displacing and excluding water molecules from the propagation environment.

Another object of the invention is to provide methods and apparatus for removing foreign matter from the surface of a sample, wherein the cleaning and inspection steps are conducted simultaneously, desirably in a "dry" environment. According to one aspect of the invention directed to such an object, methods are provided for removing a particle of foreign matter from a surface of a sample. According to a representative embodiment of such a method, a pulse of laser light is directed from a laser light source to a locus on the surface of the sample. While directing the pulse of laser light in such a manner, the locus is observed. Thus, there is no need for the cleaning step and inspection step to be performed separately. Also, there is no need for the cleaning and inspection steps to be repeated because the state actual cleaning is observable in real time, thereby increasing productivity and lowering manufacturing costs associated with devices made from the sample.

This method can include the step of forming a film of water on the surface of the sample. A propagation path can be provided for laser light propagating from a laser source to the sample surface. In the propagation path can be provided an environment exhibiting essentially no absorption of the laser light at a wavelength at which water would absorb the laser light.

According to another aspect of the invention, apparatus are provided for removing a particle of foreign matter from a surface of a sample. A representative embodiment of such an apparatus comprises a pulsed laser light source that produces pulsed laser light. An optical system is situated relative to the laser light source and configured to irradiate a locus on a sample with the pulsed laser light. The apparatus also includes an observation system situated relative to the sample and configured for observing the locus of the workpiece as the locus is being irradiated with the pulsed laser light. The observation system can comprise an environmental scanning electron microscope (ESEM). An ESEM is especially advantageous because observations can be performed therewith at high accuracy and precision due to the high resolution obtainable using an ESEM.

Such an apparatus can also include an applicator situated and configured to form a film of water on the surface of the sample. Such an apparatus can also include a propagation path extending from the laser light source to the sample. As summarized above, the propagation path provides a propagation environment for the laser light that exhibits essentially no absorption of the laser light at a wavelength at which water would absorb the laser light.

Another object of the invention is to provide methods and apparatus for removing particles of foreign matter from the surface of a sample, wherein the intensity of the laser light can be maintained sufficiently low to avoid damaging the surface of the sample. To such end and according to another aspect of the invention, methods are provided that include the step of directing a pulse of laser light from a laser light source to a locus on the surface of the sample. While performing such irradiation of the locus, the sample is vibrated. Such vibration facilitates dislodgment of the particles from the sample surface and thereby allows a lesser intensity of laser light to be used than would otherwise be necessary if the sample were not vibrated. Such methods can also include the step of observing the locus while irradiating the locus. Also, such methods can include the steps of forming a film of water on the surface of the sample, and passing the laser light (as it propagates from a source to the sample) through a propagation path containing an environment exhibiting essentially no absorption of the laser light at a wavelength at which water would absorb the laser light.

According to another aspect of the invention, apparatus are provided that achieve vibration of the sample as the sample is being irradiated with pulses of laser light. A representative embodiment of such an apparatus comprises a pulsed laser light source that produces pulsed laser light. An optical system is situated relative to the laser light source and configured to irradiate a locus on a sample with the pulsed laser light. The apparatus also includes a sample vibrator situated and configured to vibrate the sample as the locus on the surface of the sample is being irradiated with the pulsed laser light. Such an apparatus can also include an applicator situated and configured to form a film of water on the surface of the sample, and can include a propagation path that provides a propagation environment for the laser light that exhibits essentially no absorption of the laser light at a wavelength at which water would absorb the laser light.

The foregoing and additional features and advantages of the invention will be more readily apparent from the following detailed description, which proceeds with reference to the accompanying drawings.

DETAILED DESCRIPTION

The invention is described below in the context of various embodiments that are not to be construed as limiting in any way.

Representative Embodiment 1

Figure 1:
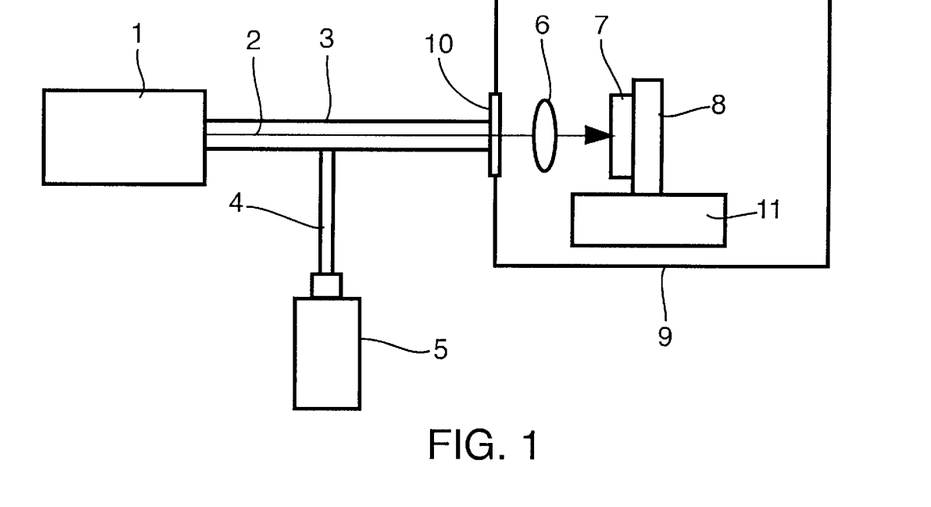
FIG. 1 depicts an apparatus for removing fine particles according to a first representative embodiment of the present invention.

This embodiment is illustrated in FIG. 1. The apparatus of FIG. 1 comprises a laser source 1 that produces pulses of laser light 2. The laser light 2 passes through a beam conduit 3 from the laser source 1 to a chamber 9. The beam conduit 3 is charged with a gas supplied by a gas supply 5 through a gas-introduction tube 4. The beam conduit 3 terminates at the chamber 9 with a window 10 that is transparent to the laser light 2 while providing separation of the interior of the beam conduit 3 from the interior of the chamber 9. The laser light 2 passes through a lens 6 to impinge on a sample 7 (e.g., semiconductor wafer or reticle to be used for microlithographically transferring a pattern to the wafer). The sample 7 is mounted on a cooling stage 8 situated within the chamber 9. The cooling stage 8 is mounted to a movable stage 11.

The laser source 1 is operable to produce, in this embodiment, a pulsed laser light having a wavelength that is readily absorbed by water (about 2.5 to 10 $\mu$m). To such end, a suitable laser source 1 is an Er:YAG laser, a carbon dioxide laser, or the like. Alternatively, the laser source 1 can be a laser producing a wavelength that can be converted to a suitable wavelength for absorption by water. Peak absorption by water occurs within a wavelength range of 2.9 to 3 $\mu$m; hence, cleaning can be performed at particularly high efficiency if the laser light 2 is within this range. Desirably, the intensity of the pulsed laser light 2 is sufficiently low to avoid light-induced damage to the surface of the sample 7. For example, if the laser source 1 is an Er:YAG laser, sufficient cleaning power can be attained, without the sample 7 being damaged or destroyed, by setting the intensity to a few hundred millijoules per square centimeter per pulse.

The gas provided by the supply 5 is an "inert" gas such as nitrogen, wherein "inert" means that the gas does not undergo any chemical reactions with the sample. The gas should be "dry" (by which is meant that the gas lacks any significant concentration of water vapor). The gas is not limited to nitrogen, however, and other types of inert gases, such as the noble gases and including mixtures of such gases, can be used.

If the beam conduit 3 is not well sealed and/or has a subatmospheric pressure inside, there is a possibility of incursion by outside air into the beam conduit, which can introduce unwanted water vapor. To prevent such incursion, the gas atmosphere inside the beam conduit 3 is maintained at a pressure above atmospheric.

The window 10 is made of a material that does not significantly absorb the laser light 2. Suitable materials include anhydrous synthetic quartz, zinc selenide, or the like. (As used herein, "anhydrous" means lacking water.)

The pulsed laser light 2 from the laser source 1 propagates through the beam conduit 3 and is focused by the lens 6 so as to irradiate a locus on the sample 7. Meanwhile, the beam conduit is charged with the gas provided by the gas supply 5 through the gas-introduction tube 4. For irradiation by the laser light 2 entering the chamber 9 through the window 10, the sample 7 is mounted on the cooling stage 8. The stage 11 achieves movement as required of the cooling stage 8 (and thus the sample 7) relative to the beam of pulsed laser light 2.

The cooling stage 8 cools the sample 7, which causes droplets of water to condense, from the atmosphere inside the chamber 9, on the surface of the sample 7. Appropriate movement of the stage 11 allows any location on the surface of the sample 7 to be irradiated by the laser light 2. Because the gas introduced into the beam conduit 3 contains substantially no water vapor, the laser light 2 propagates from the source 1 to the window 10 without experiencing any significant reduction in beam intensity. The pulsed laser light 2 irradiating the surface of the sample 7 is absorbed by condensed water at the irradiation locus on the sample surface. The irradiated water rapidly evaporates. The resulting rapid production of water vapor at the irradiation locus dislodges foreign particulate matter from the sample surface.

Although, in this embodiment, a cooling stage 8 is used to produce a layer of condensed water vapor on the surface of the sample 7, alternative means can be employed to achieve such an end. For example, a film of water can be applied to the sample surface by spraying.

Because the atmosphere inside the chamber 9 contains water vapor, the atmosphere will, of course, absorb the pulsed laser light 2. However, the distance within the chamber 9 traversed by the laser beam propagating from the window 10 to the sample 7 is as small as possible, especially relative to the length of the beam conduit 3. Consequently, the amount of absorption occurring within the chamber 9 is too small to pose any practical problem.

Representative Embodiment 2

Figure 2:
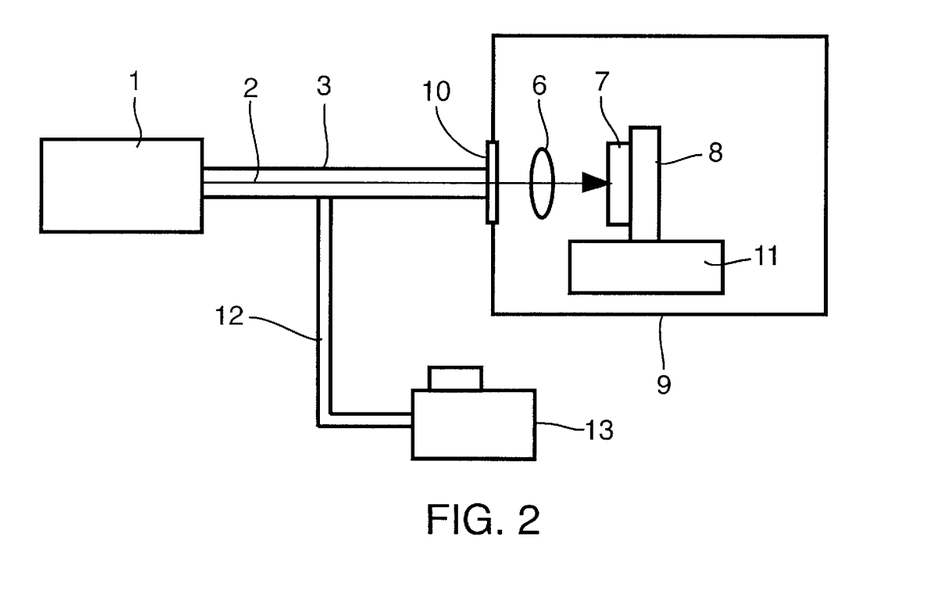
FIG. 2 depicts an apparatus for removing fine particles according to a second representative embodiment of the present invention.

This embodiment is shown in FIG. 2, in which components that are the same as in FIG. 1 have the same reference numerals and are not described further. Specifically, in FIG. 2, the gas supply 5 and gas-introduction tube 4 of FIG. 1 are replaced by an exhaust conduit 12 and a vacuum pump 13. The exhaust conduit connects the beam conduit 3 to the vacuum pump 13. Thus, the vacuum pump keeps the atmosphere inside the beam conduit 3 at a sufficiently low pressure ("vacuum") to allow the laser beam 2 to pass through the beam conduit 3 from the laser source 1 to the window 10 without experiencing any significant absorption. I.e., the vacuum pump 13, by evacuating the beam conduit 3, removes substantially all water vapor from the atmosphere inside the beam conduit 3. Accordingly, the pulsed laser light 2 propagates from the source 1 to the window 10 without being attenuated.

By way of example, the atmosphere inside the beam conduit 3 is maintained at a "vacuum" of 10 Pa ($7.5 \times 10^{-2}$ Torr) to achieve sufficiently low attenuation of the laser beam 2 and thus achieve effective cleaning of the surface of the sample 7. In any event, the "vacuum" level inside the beam conduit 3 is determined and maintained such that any decrease in the intensity of the laser light 2 passing through the beam conduit 3 is within a permissible range.

Representative Embodiment 3

Figure 3:
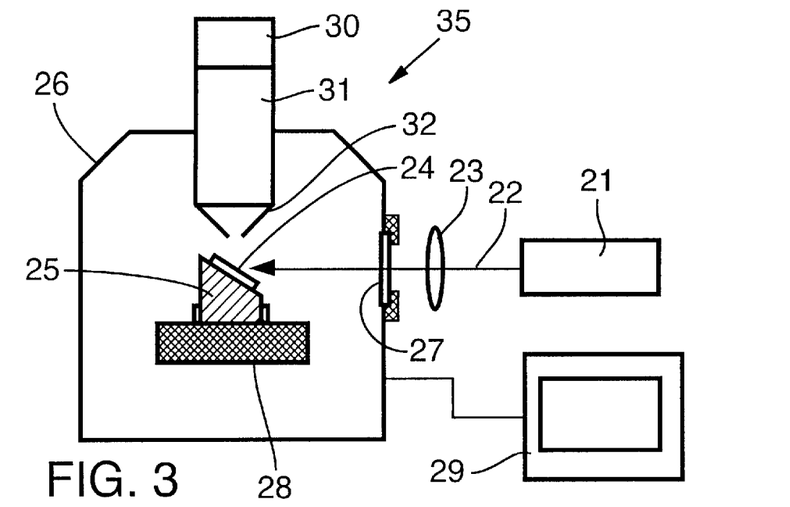
FIG. 3 depicts an apparatus for removing fine particles according to a third representative embodiment of the present invention.

This embodiment, shown in FIG. 3, comprises a pulse laser source 21 that produces a beam 22 of pulsed laser light. The laser beam 22 passes through a lens 23 to a sample 24. The sample 24 is situated in a chamber 26 of an environmental scanning electron microscope (ESEM) 35. Within the chamber 26, the sample 24 is mounted on a sample holder 25 that, in turn, is mounted on a movable stage 28. The laser beam 22 enters the chamber 26 through a window 27 to impinge on the surface of the sample 24. The ESEM comprises an electron gun 30, a lens barrel 31, a secondary electron detector 32, and a monitor 29. The lens barrel 31 comprises any of various electron lenses and deflectors (not shown) suitable for directing an electron beam produced by the electron gun 30 to impinge on the surface of the sample 24. Secondary electrons released from the sample surface being bombarded with the electron beam are captured by the secondary electron detector 32. The resulting data is processed and displayed as a corresponding image on the monitor 29.

The lens 23 serves to focus the beam 22 of pulsed laser light on a desired locus on the surface of the sample 24. To select the locus, the sample 24 (mounted on the sample holder 25) is appropriately moved by the stage 28 that achieves movement of the sample in at least two dimensions. The stage 28 also positions the sample 24 to a position at which the locus irradiated by the laser beam 22 is observable by the ESEM 35. I.e., the electron beam propagating toward the sample 24 from the lens barrel 31 and the laser beam 22 propagating from the window 27 desirably impinge on the sample 24 at the same locus.

The window 27 is transparent to the wavelength of the laser beam 22. If the wavelength is within the range of 2.5 to 10 µm (produced by, e.g., an Er:YAG laser or a $CO_2$ laser), then the window 27 is made of anhydrous synthetic quartz, zinc selenide, or other material that absorbs little to none of the light in the beam.

Upon receiving a pulse of the laser light 22, the irradiated locus on the sample 24 exhibits rapid thermal expansion. During such an instant, any particles adhering to the surface of the sample 24 are accelerated relative to the sample and thus separated from the surface of the sample 24.

The ESEM 35 is a type of scanning electron microscope (SEM) in which the sample 24 is irradiated with an electron beam emitted from the electron gun 30 and narrowly focused by the lens barrel 31. As noted above, secondary electrons emitted by the surface of the sample 24 in response to being irradiated by the electron beam are collected by the secondary electron detector 32. The resulting data, in the form of an "image" of the sample surface 24, are displayed on the monitor 29. In contrast with results obtained with an ordinary SEM, the sample surface (as a result of being imaged using an ESEM) can be observed in an atmosphere containing water vapor (pressure in the chamber 26 about 200 to 500 Pa) rather than under a high vacuum (about $10^{-3}$ to $10^{-4}$ Pa) required for an ordinary SEM. Thus, the monitor 29 displays not only images of the locus before being irradiated by the laser beam 22 but also images of the locus after being irradiated by the laser beam 22. In contrast to an ordinary SEM, the secondary electron detector 32 of the ESEM 35 is insensitive to light. As a result, it is possible to irradiate the sample 24 with the laser beam 22 while the sample is being observed using the ESEM 35.

While a locus on the surface of the sample 24 is being irradiated with the pulsed laser beam 22, an operator can simultaneously observe (using the monitor 29) actual removal, in real time, of the target particles from the locus. Thus, the operator can confirm, during actual cleaning, efficacy of the cleaning procedure and execute repeated irradiations of the locus as required to achieve the desired cleaning result.

Since the sample 24 can be moved at least two-dimensionally using the stage 28, cleaning of the sample 24 can be conducted over the entire sample surface without having to remove the sample from the ESEM 35. Also, because ESEM observations of the sample 24 can be conducted in a water-vapor atmosphere inside the chamber 26, condensation of water vapor on the sample surface can be facilitated by reducing the temperature of the sample. Thus, a water film can be effectively formed on the sample surface within the chamber 26. As discussed above, such a water film can improve the effectiveness with which irradiation by the laser beam 22 removes particulate contaminants from the sample surface.

Although an ESEM is used in this embodiment for observing the sample surface, any of various other surface-examining techniques alternatively can be employed that allow observations of the surface to be conducted during cleaning. An ESEM is advantageous because, inter alia, of the high resolution obtainable using this technique. ESEM also provides other benefits as noted above. A suitable alternative observation technique exhibits a resolution comparable to that obtained with ESEM. The required resolution is determined largely by the size of the particles to be removed from the sample surface. Hence, when less resolution can be tolerated, observations can be conducted using a light microscope, for example. However, whenever an optical microscope is used, it is possible that the laser light used for cleaning will hamper observations. In such a case, the observation system can be structured and configured to include a filter that obstructs passage through the microscope of the cleaning light.

The pulse laser 21 can be any of various suitable lasers. For example, if surficial cleaning can be performed without water vapor or a film of water on the sample, excimer lasers are effective, such as a KrF, ArF, or XeCl excimer laser. Other lasers suitable for performing cleaning without water are YAG lasers and nitrogen lasers. (These lasers and excimer lasers produce light that is not readily absorbed by water.) Under such conditions, the interior of the chamber 26 can be under a high vacuum if required. Alternatively, under situations in which the contaminant particles on the sample can be effectively removed by irradiation of a water film on the sample surface or by irradiation in a water vapor atmosphere, the laser 21 produces a wavelength (e.g., about 2.5 to 10 µm) readily absorbed by water. Suitable lasers producing such wavelengths are carbon dioxide lasers and Er:YAG lasers. The intensity of the pulsed laser light 22 is desirably less than an intensity that otherwise would damage or destroy the sample surface. A suitable intensity is a few hundred millijoules per square centimeter for each pulse.

In any event, this embodiment allows sample cleaning to be performed simultaneously with making observations of the sample surface. As a result, productivity is increased and manufacturing costs are reduced.

Representative Embodiment 4

Figure 4:
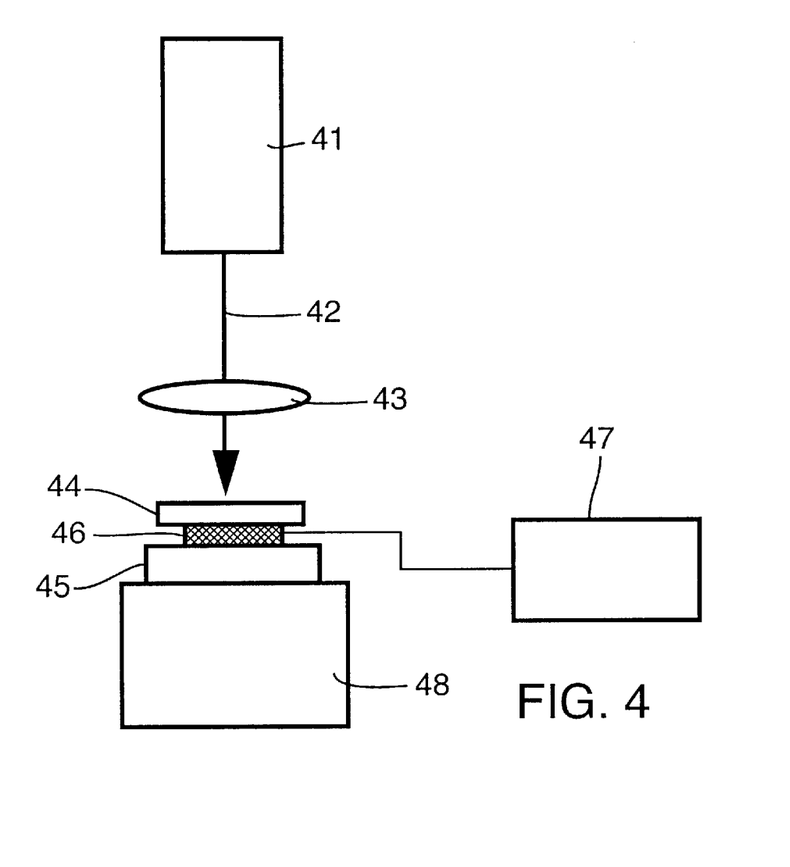
FIG. 4 depicts an apparatus for removing fine particles according to a fourth representative embodiment of the present invention.

This embodiment, shown in FIG. 4, comprises a laser source 41 that produces a beam of pulsed laser light 42. The beam 42 passes through a lens 43 to a surface of a sample 44. The sample 44 is mounted to a sample holder 45 and is in contact with an actuator 46. The actuator 46 is connected to and energized by an actuator-drive power supply 47. The sample 44 (and the actuator 46 in this embodiment) are mounted on a movable stage 48.

The laser source 41 can be an excimer laser such as a KrF, ArF, or XeCl excimer. Alternatively, the laser source 41 can be any of various other suitable lasers such as a YAG laser, a nitrogen laser, a carbon dioxide laser, or an Er:YAG laser. As discussed above, the laser beam 42 is of a sufficiently low intensity to avoid damaging or destroying the surface of the sample 44. By way of example, a suitable intensity is a few hundred millijoules per square centimeter per pulse.

The actuator 46 can be a piezo element energized by the actuator-drive power supply 47. Energization (by the power supply 47) causes the actuator 46 to undergo periodic motion in a pre-selected direction (the direction of motion can be changed as required).

The pulsed laser light 42 from the laser source 41 is focused by the lens 43 and directed at the sample 44. During irradiation, the sample 44 is mounted on the sample holder 45. The movable stage 48 allows movement of the substrate holder 45 in any of the three axial directions X, Y, and Z.

As discussed above, cleaning of the surface of the sample is facilitated by localized irradiation of the sample surface with the laser beam 42. In this embodiment, the sample 44 is vibrated as the sample 44 is irradiated. Vibration of the sample 44 is achieved by energizing the actuator 46 (by applying an AC voltage to the actuator 46 from the actuator-drive power supply 47). Vibration of the actuator 46 causes corresponding vibration of the sample 44 in contact with the actuator 46. Such vibration facilitates dislodgment of particulate matter from the sample surface as well as movement of the dislodged particulate matter away from the sample.

Upon receiving a pulse of laser light 42, the irradiated locus on the sample surface experiences a rapid thermal expansion. Any foreign particulate matter adhering to the surface of the sample 44 at the irradiated locus is also subjected to rapid thermal expansion that tends to dislodge the particulate matter from the sample surface, thereby achieving cleaning at the locus. Because the sample surface is also being simultaneously vibrated, dislodgment and separation of the particulate matter from the sample surface is further enhanced. This allows the laser beam 42 to have a lower intensity (and thus a reduced probability of damaging the sample) than would otherwise be needed for adequate cleaning if the sample were not vibrated.

To achieve cleaning at multiple loci over the sample surface, the sample 44 (held by the sample holder 45) is moved as required by the stage 48 so as to present new loci to be irradiated by the laser beam 42. Thus, the entire sample surface can be cleaned.

For optimal cleaning under moist conditions, the AC voltage applied by the power supply 47 to the actuator 46 is in the range of 10 Kilohertz to 100 Megahertz.

Representative Embodiment 5

Figure 5:
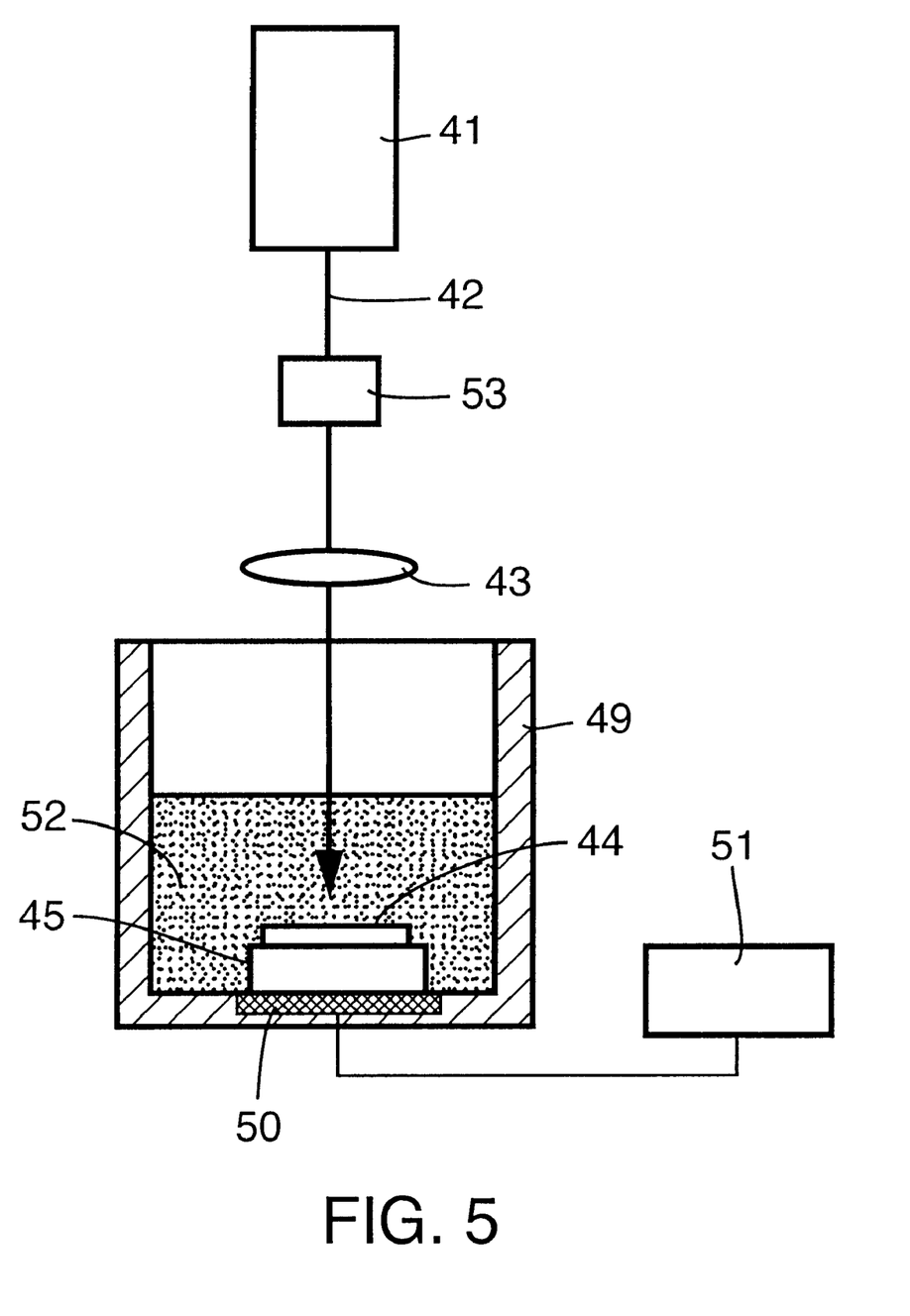
FIG. 5 depicts an apparatus for removing fine particles according to a fifth representative embodiment of the present invention.

This embodiment is shown in FIG. 5, in which components that are the same as described above have the same reference numerals and are described further. The FIG. 5 embodiment includes a treatment vessel 49, a vibration element 50, a vibration-element-drive power supply 51, and a deflector 53. The treatment vessel 49 contains a liquid 52. The respective structures and configurations of the treatment vessel 49, the vibration element 50, and the power supply 51 can be the same as in a conventional ultrasonic cleaner. Other components of this embodiment include a pulsed laser source 41 that produces a pulsatile laser light 42, and a sample holder 45 to which a sample 44 is mounted. The laser light 42 is focused onto a locus on the surface of the sample 44. Meanwhile, the deflector 53 scans the pulsed laser light 42 over the surface of the sample 44. The deflector can be, e.g., a galvanometric scanner that deflects reflected light by electrically moving or rotating a mirror surface. In this embodiment, the laser source 41 emits a pulsatile laser light 42 having a wavelength that is not absorbed by the liquid 52. To such end, the laser source 41 can be, e.g., a KrF excimer laser.

The sample 44 to be cleaned is immersed in the liquid 52 in the treatment vessel 49. The vibration element 50 contacts the treatment vessel 49. As the vibration element 50 is energized by the power supply 51 (which supplies an AC voltage to the vibration element 50), the vibration element 50 exhibits a vibration that is translated to the inner walls of the treatment vessel 49. The vibration propagates through the liquid 52 to the sample 44. Meanwhile, as required, the deflector 53 changes the direction of propagation of the pulsed laser light 42.

The result of this vibration is that a force is applied to particulate foreign matter, adhering to the sample 44, serving to dislodge the particulate matter from the sample surface and facilitating movement of the dislodged particles away from the surface of the sample 44. Such forces help to break bonds between the particles and the sample surface.

Meanwhile, the sample 44 is irradiated with the pulsed laser light 42 from the laser source 41. The irradiated loci on the sample surface thus undergo rapid thermal expansion, which causes particulate foreign matter adhering to the sample surface at the loci to be accelerated away from the surface of the sample 44 and thereby removed from the surface.

Cleaning is enhanced in this embodiment because the vibration translated to the sample causes preliminary loosening of the particulate foreign matter from the sample 44. Hence, the pulsed laser light 42,can have a lower intensity than otherwise would be required for satisfactory cleaning performed without vibration. As the propagation direction of the pulsed laser light 42 is changed by the deflector 53, the pulsed laser light can be scanned over the surface of the sample 44, ultimately allowing the entire sample surface to be cleaned.

The liquid 52 can contain any of various additives to weaken bonds between particulate foreign matter and the sample surface, thereby enhancing the cleaning effect. Examples of suitable additives include, but are not limited to, surfactants (e.g., alkylbenzenesulfonates, alkylsulfuric acid esters, and surfactants based on nonylphenol, alkylphenols, and polyalkylene glycols). Usually, if a surfactant is used, the surfactant is in solution with water in the liquid 52. Alternatively or in addition, the liquid 52 can contain an acid such as sulfuric acid, nitric acid, hydrochloric acid, hydrofluoric acid, or acetic acid); or a base such as caustic soda, caustic potash, or choline. The liquid 52 need not be water or include water. Any of various other liquids can be used including, but not limited to, organic solvents (e.g., ethanol, isopropyl alcohol, acetone, toluene, xylene, and trichloroethane). The liquid 52 can be formulated as a functional detergent having a profile such as $NH_4OH/H_2O_2/H_2O$; $HCl/H_2O_2/H_2O$; $HF/H_2O_2/H_2O$; $H_2SO_4/H_2O_2$; $H_2SO_4/O_3/H_2O$; or $H_2SO_4/(NH_4)_2S_2O_8$).

Whereas the invention has been described above in connection with multiple representative embodiments, it will be understood that the invention is not limited to those embodiments. On the contrary, the invention is intended to encompass all modifications, alternatives, and equivalents as may be included within the spirit and scope of the invention as defined by the appended claims.

What is claimed is:

1. A method for removing a particle of foreign matter from a surface of a sample, comprising:

(a) forming a film of water on the surface of the sample;

(b) providing a propagation path for laser light propagating from a laser source to the sample surface, and providing in the propagation path an environment exhibiting essentially no absorption of the laser light at a wavelength at which water would absorb the laser light; and (c) directing a pulse of the laser light, having a wavelength that is absorbed by water, from the laser source through the propagation path to a locus on the surface of the sample, the locus being a location on the surface of the sample at which the particle of foreign matter is attached to the sample surface.

2. The method of claim 1, wherein the environment in the propagation path includes a gas.

3. The method of claim 2, wherein the gas lacks water vapor.

4. The method of claim 2, wherein the gas is an inert gas.

5. The method of claim 1, wherein the environment in the propagation path is a vacuum.

6. An apparatus for removing a particle of foreign matter from a surface of a sample, comprising:

(a) a pulsed laser light source that produces pulsed laser light having a wavelength absorbed by water;

(b) an applicator situated and configured to form a film of water on the surface of the sample; and (c) a propagation path extending from the laser light source to the sample, the propagation path providing a propagation environment for the laser light that exhibits essentially no absorption of the laser light at a wavelength at which water would absorb the laser light.

7. The apparatus of claim 6, further comprising an optical system situated relative to the laser light source and configured to irradiate a locus on a sample with the pulsed laser light, the locus including a particle of foreign matter adhering to the sample.

8. The apparatus of claim 6, wherein the propagation environment is a vacuum.

9. The apparatus of claim 6, wherein the propagation environment includes a gas.

10. The apparatus of claim 9, wherein the gas lacks water vapor.

11. The apparatus of claim 9, wherein the gas is an inert gas.

12. The apparatus of claim 6, wherein the propagation path comprises a beam conduit.

13. The apparatus of claim 12, wherein:

the propagation environment is a vacuum; and the beam conduit is connected to a vacuum pump.

14. The apparatus of claim 12, wherein:

the propagation environment includes a gas; and the beam conduit is connected via a gas-supply tube to a gas supply.

15. The apparatus of claim 7, wherein the optical system comprises a lens.

16. An apparatus for removing a particle of foreign matter from a surface of a sample, comprising:

(a) a pulsed laser light source that produces pulsed laser light having a wavelength absorbed by water;

(b) means for irradiating a sample, to which a particle of foreign matter is adhering, with the pulsed laser light, said means including propagation-path means extending from the laser light source to the sample;

(c) means for filling said propagation-path means with an environment that lacks water vapor; and (d) means for causing a film of water to adhere to the sample.

17. A method for removing a particle of foreign matter from a surface of a sample, comprising:

(a) directing a pulse of laser light from a laser light source to a locus on the surface of the sample, the locus being a location on the surface of the sample at which the particle of foreign matter is attached to the sample surface; and (b) while performing step (a), observing the locus.

18. The method of claim 17, further comprising the step of forming a film of water on the surface of the sample.

19. The method of claim 18, further comprising the step of providing a propagation path for laser light propagating from a laser source to the sample surface, and providing in the propagation path an environment exhibiting essentially no absorption of the laser light at a wavelength at which water would absorb the laser light.

20. An apparatus for removing a particle of foreign matter from a surface of a sample, comprising:

(a) a pulsed laser light source that produces pulsed laser light;

(b) an optical system situated relative to the laser light source and configured to irradiate a locus on a sample with the pulsed laser light, the locus including a particle of foreign matter adhering to the sample; and (c) an observation system situated relative to the sample and configured for observing the locus of the workpiece as the locus is being irradiated with the pulsed laser light.

21. The apparatus of claim 20, wherein the observation system comprises an environmental scanning electron microscope.

22. The apparatus of claim 20, further comprising an applicator situated and configured to form a film of water on the surface of the sample.

23. The apparatus of claim 22, further comprising a propagation path extending from the laser light source to the sample, the propagation path providing a propagation environment for the laser light that exhibits essentially no absorption of the laser light at a wavelength at which water would absorb the laser light.

24. The apparatus of claim 23, wherein the propagation environment is a vacuum.

25. The apparatus of claim 23, wherein the propagation environment includes a gas.

26. A method for removing a particle of foreign matter from a surface of a sample, comprising:

(a) directing a pulse of laser light from a laser light source to a locus on the surface of the sample, the locus being a location on the surface of the sample at which the particle of foreign matter is attached to the sample surface; and (b) while performing step (a), vibrating the sample.

27. The method of claim 26, further comprising the step of observing the locus while performing step (a).

28. The method of claim 27, further comprising the step of forming a film of water on the surface of the sample.

29. The method of claim 28, further comprising the step of providing a propagation path for laser light propagating from a laser source to the sample surface, and providing in the propagation path an environment exhibiting essentially no absorption of the laser light at a wavelength at which water would absorb the laser light.

30. An apparatus for removing a particle of foreign matter from a surface of a sample, comprising:

(a) a pulsed laser light source that produces pulsed laser light;

(b) an optical system situated relative to the laser light source and configured to irradiate a locus on a sample with the pulsed laser light, the locus including a particle of foreign matter adhering to the sample; and (c) a sample vibrator situated and configured to vibrate the sample as the locus on the surface of the sample is being irradiated with the pulsed laser light.

31. The apparatus of claim 30, further comprising an applicator situated and configured to form a film of water on the surface of the sample.

32. The apparatus of claim 31, further comprising a propagation path extending from the laser light source to the sample, the propagation path providing a propagation environment for the laser light that exhibits essentially no absorption of the laser light at a wavelength at which water would absorb the laser light.

33. The apparatus of claim 32, wherein the propagation environment is a vacuum.

34. The apparatus of claim 32, wherein the propagation environment includes a gas.

* * * * *

UNITED STATES PATENT AND TRADEMARK OFFICE
CERTIFICATE OF CORRECTION

PATENT NO.     : 6,407,385 B1
DATED          : June 18, 2002
INVENTOR(S)    : Okada

It is certified that error appears in the above-identified patent and that said Letters Patent is hereby corrected as shown below:

Column 3,
Lines 28-29, "the state actual" should read -- the state of actual --

Column 10,
Line 9, "42,can" should read -- 42 can --,

Signed and Sealed this

Fourteenth Day of October, 2003

JAMES E. ROGAN
*Director of the United States Patent and Trademark Office*